United States Patent
Farnworth et al.

(10) Patent No.: US 6,353,312 B1
(45) Date of Patent: *Mar. 5, 2002

(54) METHOD FOR POSITIONING A SEMICONDUCTOR DIE WITHIN A TEMPORARY PACKAGE

(75) Inventors: Warren M. Farnworth, Nampa, ID (US); Jennifer L. Folaron; Robert J. Folaron, both of Plano, TX (US); John O. Jacobson; David R. Hembree, both of Boise, ID (US); Jay C. Nelson; Lelan D. Warren, both of Dallas, TX (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 09/234,226

(22) Filed: Jan. 20, 1999

Related U.S. Application Data

(62) Division of application No. 08/767,700, filed on Dec. 17, 1996, now Pat. No. 6,064,194, which is a continuation of application No. 08/228,809, filed on Apr. 18, 1994, now abandoned.

(51) Int. Cl.⁷ .............................................. G01R 31/02
(52) U.S. Cl. .................... 324/158.1; 324/765; 324/758
(58) Field of Search .............................. 324/73.1, 158.1, 324/758, 765, 500, 537; 382/8, 151; 348/126, 86, 87; 901/48; 414/418, 425–426, 798, 783, 730; 29/833

(56) References Cited

U.S. PATENT DOCUMENTS

| | | |
|---|---|---|
| 4,281,449 A | 8/1981 | Ports et al. |
| 4,312,117 A | 1/1982 | Robillard et al. |
| 4,500,836 A | 2/1985 | Staudacher |
| 4,526,646 A | 7/1985 | Suzuki et al. |
| 4,543,659 A | 9/1985 | Ozaki |

(List continued on next page.)

FOREIGN PATENT DOCUMENTS

| | | |
|---|---|---|
| JP | 55-41775 | 3/1980 |
| JP | 55-128840 | 10/1980 |
| JP | 55-164376 | 12/1980 |

OTHER PUBLICATIONS

Larry Gilg, Lo–Soun Su, Mark Louis, "Known Good Die (KGD) Assurance Technologies: United States Competitive Assessment," *Sematech*, Jul. 31, 1995.

Dr. Larry Schmitt, "A Vision of Vision in the Gigabit Era," *Semiconductor International*, pp. 120–124, Jun. 1993.

"Equipment, Processes and Methods for High Volume KGD Production," Third Annual Manufacturing Test Conference, pp. 150–171, Jul. 1994.

Known Good Die Workshop, *Sematech*, Sep. 13 & 14, 1995.

Andrews et al., Consortia for Known Good Die (KGD), Feb. 1994.

(List continued on next page.)

*Primary Examiner*—Vinh P. Nguyen
(74) *Attorney, Agent, or Firm*—TraskBritt

(57) ABSTRACT

A method for positioning a semiconductor die within a temporary package, including forming a representation of at least a portion of a semiconductor die, moving the semiconductor die to a location proximate a temporary package, and comparing the representation of the at least a portion of the semiconductor die to a representation of at least a portion of the temporary package. The compared representations are then used to define movement of a die moving assembly, in order to move the die to place the semiconductor die and the temporary package into a desired relationship to one another. A restraining device is then secured to the temporary package to retain the semiconductor die in the desired relationship to the temporary package.

9 Claims, 14 Drawing Sheets

U.S. PATENT DOCUMENTS

| | | | |
|---|---|---|---|
| 4,585,991 A | 4/1986 | Reid et al. | |
| 4,677,474 A | 6/1987 | Sato et al. | |
| 4,736,437 A | 4/1988 | Sacks et al. | |
| 4,859,614 A | 8/1989 | Sugahara et al. | |
| 4,899,107 A | 2/1990 | Corbett et al. | |
| 4,899,921 A | 2/1990 | Bendat et al. | |
| 4,924,589 A | 5/1990 | Leedy | |
| 4,929,893 A | 5/1990 | Sato et al. | |
| 4,980,971 A * | 1/1991 | Bartschat et al. | 29/833 |
| 4,992,850 A | 2/1991 | Corbett et al. | |
| 5,002,895 A | 3/1991 | LeParquier et al. | |
| 5,008,614 A | 4/1991 | Shreeve et al. | |
| 5,008,617 A | 4/1991 | Czubatyj et al. | |
| 5,014,161 A | 5/1991 | Lee et al. | |
| 5,023,189 A | 6/1991 | Bartlow | |
| 5,052,606 A | 10/1991 | Cipolla et al. | |
| 5,059,559 A | 10/1991 | Takahashi et al. | |
| 5,073,117 A | 12/1991 | Malhi et al. | |
| 5,088,190 A | 2/1992 | Malhi et al. | |
| 5,091,692 A | 2/1992 | Ohno et al. | |
| 5,103,557 A | 4/1992 | Leedy | |
| 5,113,565 A | 5/1992 | Cipolla et al. | |
| 5,123,823 A | 6/1992 | Banjo et al. | |
| 5,123,850 A | 6/1992 | Elder et al. | |
| 5,138,434 A | 8/1992 | Wood et al. | |
| 5,145,099 A | 9/1992 | Wood et al. | |
| 5,177,439 A | 1/1993 | Liu et al. | |
| 5,212,647 A | 5/1993 | Raney et al. | |
| 5,212,880 A | 5/1993 | Nishiguchi et al. | |
| 5,238,174 A | 8/1993 | Ricketson et al. | |
| 5,288,698 A | 2/1994 | Banjo et al. | |
| 5,326,428 A | 7/1994 | Farnworth et al. | |
| 5,367,253 A | 11/1994 | Wood et al. | |
| 5,374,888 A | 12/1994 | Karasawa | |
| 5,394,100 A | 2/1995 | Bohler et al. | |
| 5,416,592 A | 5/1995 | Mori et al. | |
| 5,440,240 A * | 8/1995 | Wood et al. | 324/765 |
| 5,448,165 A | 9/1995 | Hodge et al. | |
| 5,451,165 A | 9/1995 | Cearley-Cabbiness et al. | |
| 5,463,227 A | 10/1995 | Stern et al. | |
| 5,463,325 A | 10/1995 | Fujii | |
| 5,467,517 A | 11/1995 | Sugito et al. | |
| 5,468,157 A | 11/1995 | Roebuck et al. | |
| 5,468,158 A | 11/1995 | Roebuck et al. | |
| 5,471,310 A | 11/1995 | Spigarelli et al. | |
| 5,475,317 A | 12/1995 | Smith | |
| 5,479,105 A | 12/1995 | Kim et al. | |
| 5,481,203 A | 1/1996 | Appold | |
| 5,483,174 A | 1/1996 | Hembree et al. | |
| 5,506,510 A | 4/1996 | Blumenau | |
| 5,506,684 A | 4/1996 | Ota et al. | |
| 5,510,723 A | 4/1996 | Canella et al. | |
| 5,516,023 A | 5/1996 | Kono | |
| 5,516,026 A | 5/1996 | Ariye et al. | |
| 5,517,125 A | 5/1996 | Posedel et al. | |
| 5,519,332 A | 5/1996 | Wood et al. | |
| 5,523,586 A | 6/1996 | Sakurai | |
| 5,523,696 A | 6/1996 | Charlton et al. | |
| 5,528,157 A | 6/1996 | Newberry et al. | |
| 5,528,159 A | 6/1996 | Charlton et al. | |
| 5,530,376 A | 6/1996 | Lim et al. | |
| 5,534,785 A | 7/1996 | Yoshizaki et al. | |
| 5,534,786 A | 7/1996 | Kaneko et al. | |
| 5,536,974 A | 7/1996 | Nishiguchi | |
| 5,537,051 A | 7/1996 | Jalloul et al. | |
| 5,537,204 A | 7/1996 | Woodhouse | |
| 5,539,324 A | 7/1996 | Wood et al. | |
| 5,541,524 A | 7/1996 | Tuckerman et al. | |
| 5,541,525 A | 7/1996 | Wood et al. | |
| 5,543,725 A | 8/1996 | Lim et al. | |
| 5,561,386 A | 10/1996 | Funaki et al. | |
| 5,568,057 A | 10/1996 | Kim et al. | |
| 5,571,027 A | 11/1996 | Roebuck et al. | |
| 5,574,384 A | 11/1996 | Oi | |
| 5,640,199 A | 6/1997 | Garakani et al. | |
| 5,644,245 A | 7/1997 | Saitoh et al. | |
| 5,667,129 A | 9/1997 | Morita et al. | |
| 5,794,526 A | 8/1998 | Raney | |
| 5,905,850 A * | 5/1999 | Kavch | 441/783 |
| 5,955,877 A * | 9/1999 | Farnworth et al. | 324/765 |

OTHER PUBLICATIONS

Poole, Lon, "Your Computer Revealed: Inside the Processor", *MacWorld*, Oct. 1992, pp. 136–142.

"Flip Chip Interconnect Technology, Process and Test Methods for Known Good Die," *ETEC*. (No Date).

Advertisement of Schunk Precision Workholding Systems, THK Cross roller table type VRT/VRU. (No Date).

* cited by examiner

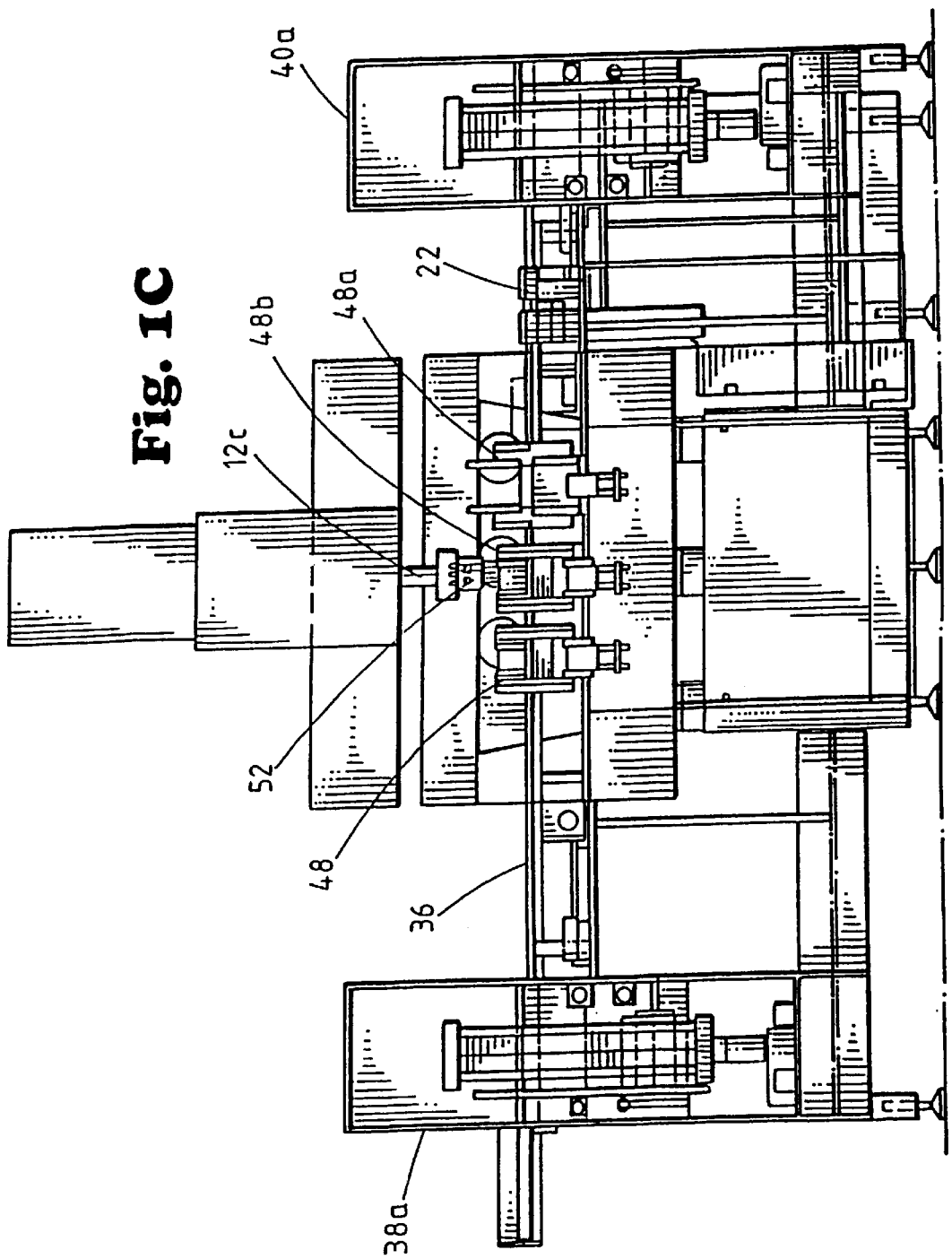

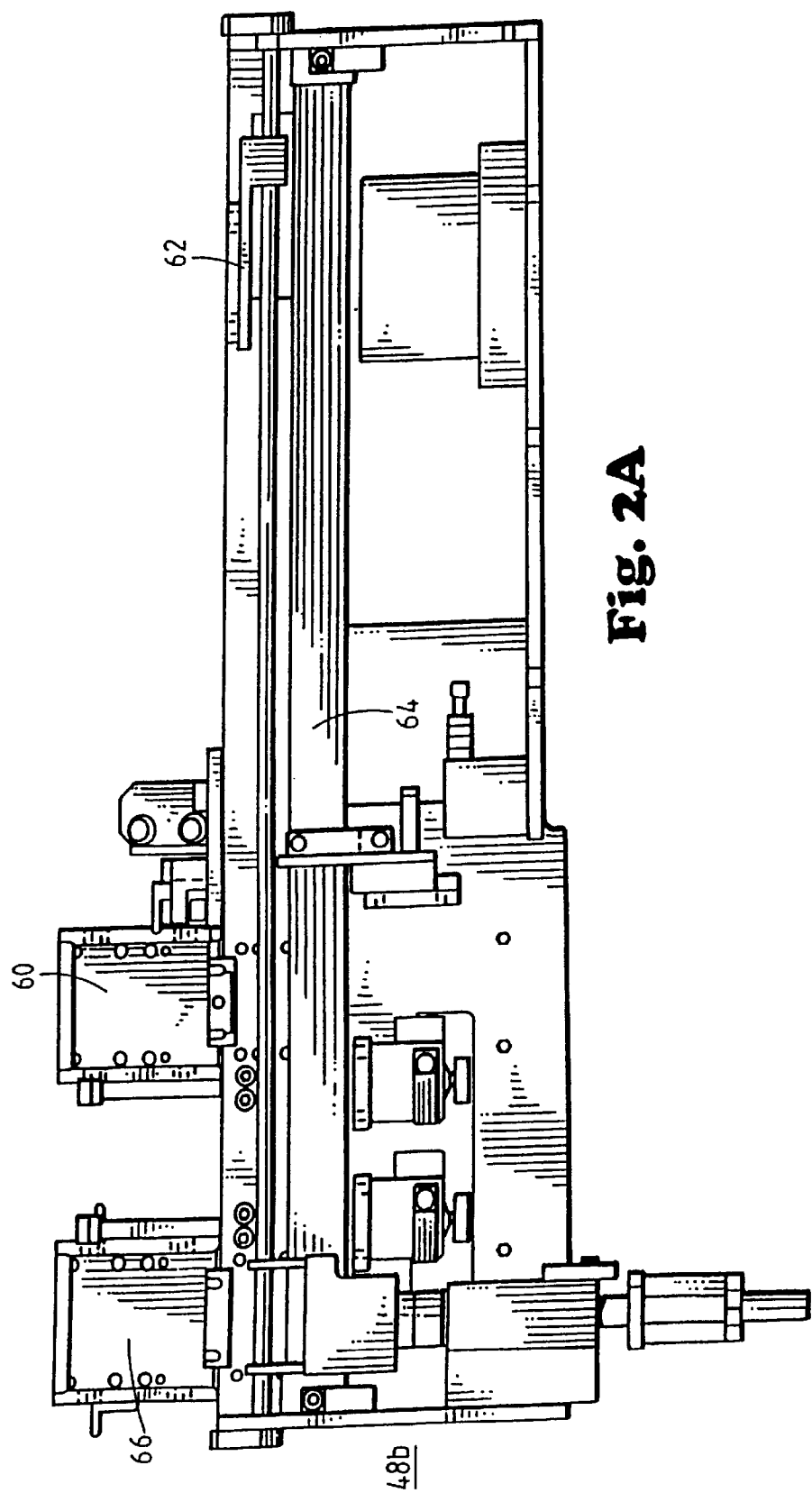

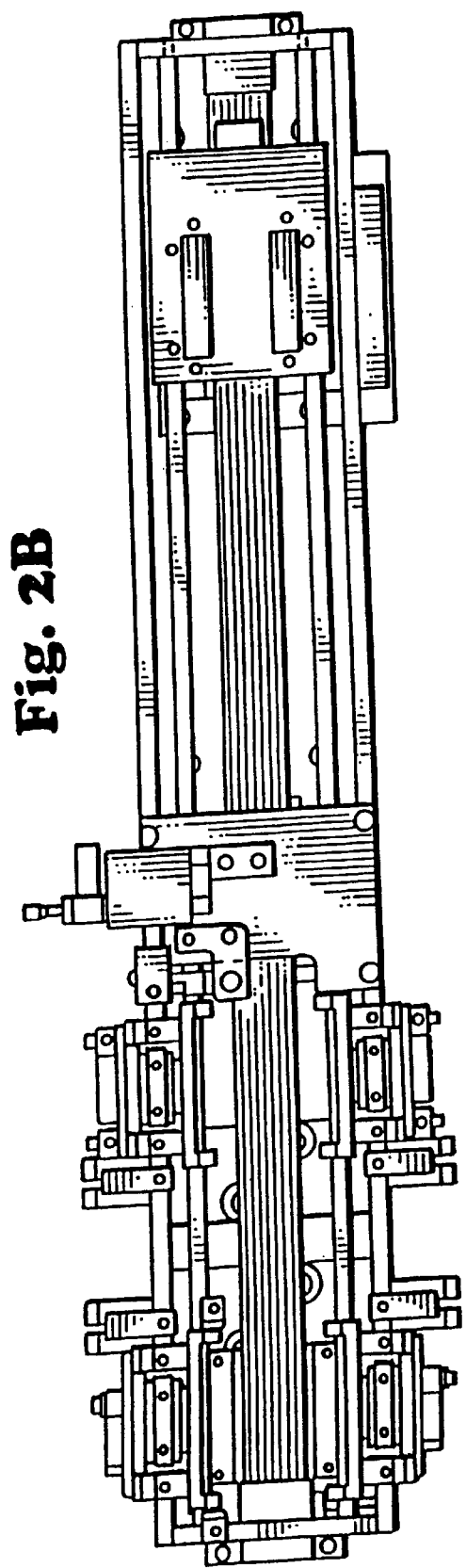

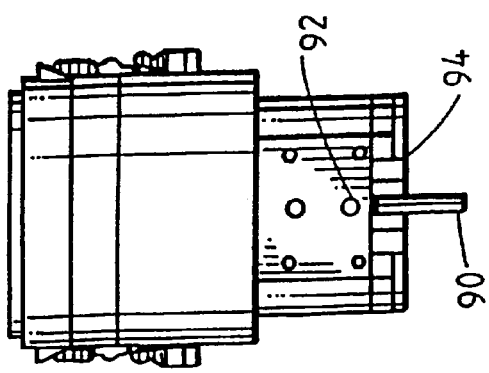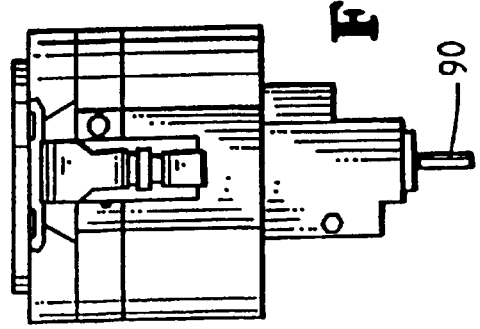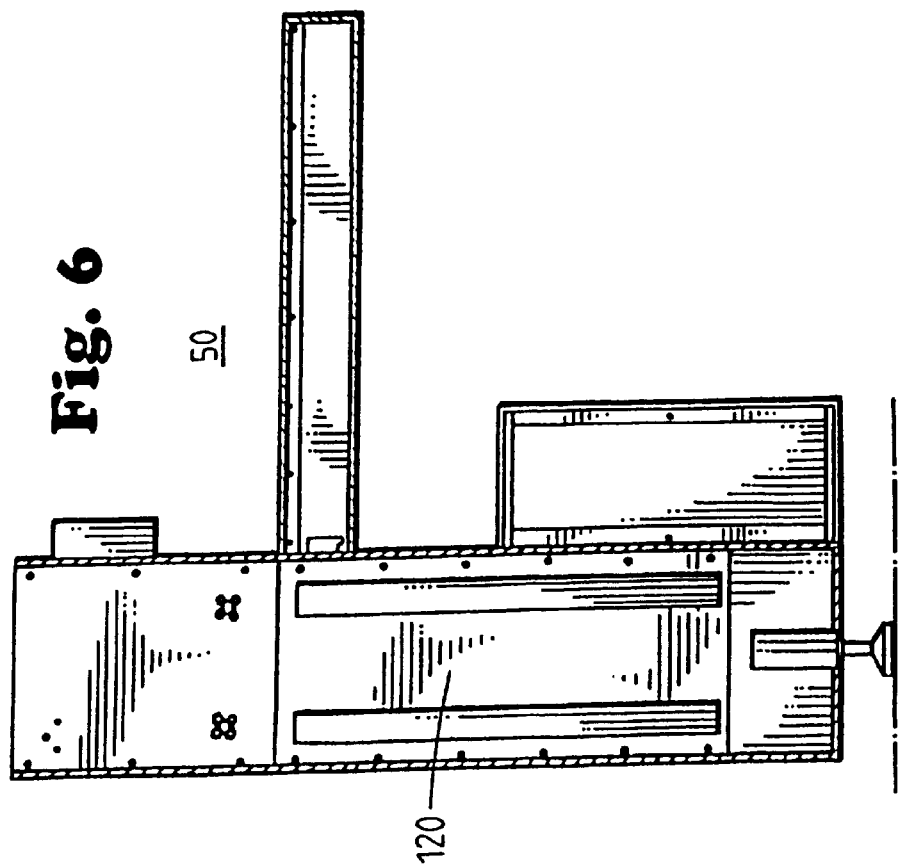

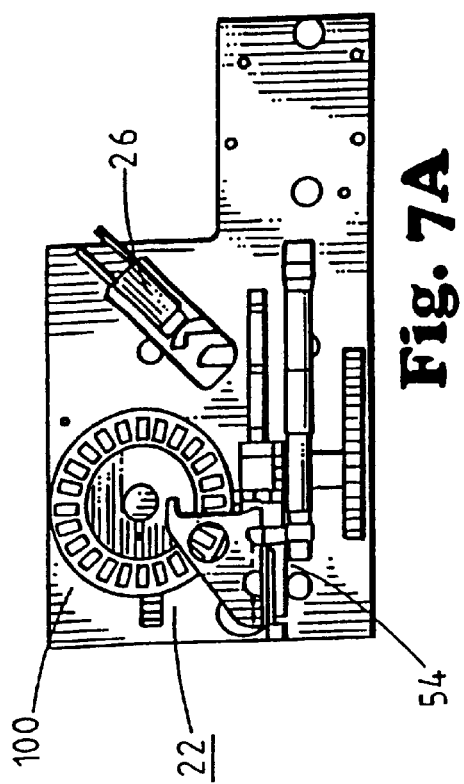
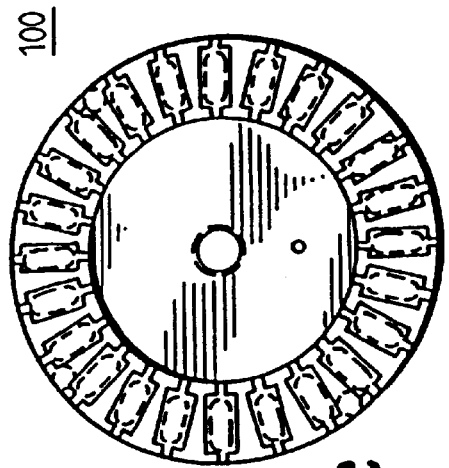
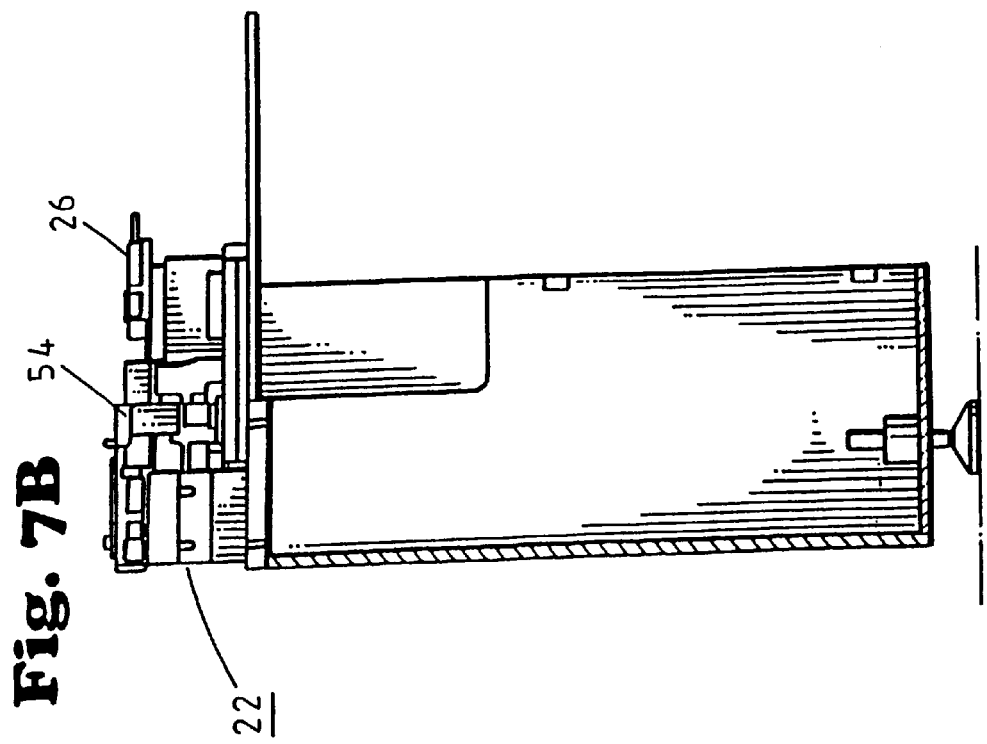

METHOD FOR POSITIONING A SEMICONDUCTOR DIE WITHIN A TEMPORARY PACKAGE

CROSS REFERENCE TO RELATED APPLICATION

This application is a divisional of application Ser. No. 08/767,700, filed Dec. 17, 1996, now U.S. Pat. No. 6,064,194, issued May 16, 2000, which is a continuation of U.S. patent application Ser. No. 08/228,809, filed Apr. 18, 1994, now abandoned.

BACKGROUND OF THE INVENTION

1. Field of the Invention

The present invention relates generally to computer-aided methods and systems for manufacturing products in a high volume, automated, continuous process and, more particularly, to improved methods and apparatus for automatically positioning electronic dice within component packages.

2. State of the Art

Integrated circuit devices are well-known in the prior art. Such devices, or so-called "dice," are normally designed to be supported or carried in a package having a plurality of pins or leads. The package serves as a carrier and as a heat sink and is normally square or rectangular in shape. The packages, which includes a cavity in which the integrated circuit die is placed, may be formed of metal, ceramic or plastic components. After the integrated circuit is secured in the cavity of the package, a component "lid" is typically placed over an exposed surface of the circuit. A bottom surface of the lid includes a "pre-form" material such as epoxy or solder that is used to secure the lid over the circuit to provide a protective cover. The pre-form is cured by placing the package in a furnace.

Packaging unusable dice which must be scrapped after testing is inefficient and costly. Accordingly, the dice are often tested for continuity during the manufacturing process. This has been accomplished by placing dice in temporary packages and subjecting the assembled package to extensive testing, which includes burn-in and discrete testing. Discrete testing includes testing the devices for speed and for errors which may occur after assembly and after burn-in. Burn-in testing accelerates failure mechanisms such that devices which have the potential to fail later but which failure would not otherwise be apparent at nominal test conditions can be eliminated.

However, testing unpackaged dice requires a significant amount of handling. The temporary package must not only be compatible with test and burn-in procedures, but must also secure the die without damaging the die at the bond pads or elsewhere during the process. Bonds pads are conductive areas on the face of the die which are used as an interconnect for connecting the die circuitry to the package. The positioning of the die within the cavity of the temporary package is therefore critical since the placement of the die bond pads relative to the temporary package electrical interconnects must be properly aligned in order to subject the die to such extensive testing.

Precising die packaging includes mechanically locating a component in a precise position or placement. Various "precising" methods for this purpose are known in the art. However, there have been several problems associated with such precising methods and systems. For example, it has been difficult to position the die bond pads in electrical contact with temporary package electrical interconnects in an accurate and consistent manner so as to facilitate a high volume, continuous manufacture of temporary packages. Another disadvantage associated with the prior art is that the die is often destroyed upon contact with the temporary package. Moreover, a significant investment in the costly integrated circuit device is often lost when the positioning of the die within the temporary package is not properly aligned. Accurate placement and positioning of the die in the temporary package is thus critical to providing acceptable results.

One attempt to overcome the problems associated with the prior art has been to precise die and packages by mechanical fixturing. However, assembly tolerances used in mechanical fixturing techniques are often insufficient to prevent improper alignment. Mechanical fixturing also leads to damage of the die or temporary package. While such techniques have proven useful in improving the accuracy and reliability of the die placement, these techniques do not enable dice to be precisely positioned within temporary packages in a manner that allows production efficiencies capable of supporting large volume operations.

Accordingly, there remains a long-felt need in the semiconductor industry to provide for improved methods and apparatus for manufacturing integrated circuit temporary packages in a high volume, cost-efficient and reliable manner which includes automatically positioning integrated circuit dice within the temporary packages such that die bond pads are in electrical contact with temporary package electrical interconnects to allow extensive testing to be performed.

BRIEF SUMMARY OF THE INVENTION

It is thus a primary object of the present invention to provide computer-controlled methods and apparatus for automating the positioning of integrated circuit devices or dice within temporary packages utilizing a high volume, continuous process.

It is another object of the invention to provide an automated apparatus for the positioning of electronic dice within temporary packages that is used in-line with other machines to facilitate formation of assembled packages which may then be subjected to continuity testing and the like.

It is yet another object of the invention to describe methods and systems for accurately positioning electronic dice within temporary packages in a reliable, cost-effective manner.

It is still another object of the invention to provide methods and apparatus for continuous positioning of integrated circuit dice within temporary packages in a production line while significantly reducing the percentage of dice and temporary packages in which continuity is not established.

Yet another object of the invention is to provide multiple inspections of the die and temporary package prior to, during and after placement of the die within the temporary package. By inspecting the die at various stages of assembly, dice which are not properly aligned or positioned can be repositioned to maximize the number of electrical contacts between the die bond pads and temporary package electrical interconnects.

It is still another object of the invention to preferably use multiple cameras to facilitate precise placement of the dice in the temporary packages in a continuous manner, thereby significantly enhancing the efficiency of the processing line and increasing the number of packages in which continuity is established.

It is still a further object of the invention to provide an apparatus for placing dice in temporary packages wherein the packages are supported on carriers such as boats or trays that are conveyed along a path through a predetermined assembly/diassembly position. A carrier preferably includes a body portion and at least one side rail having a plurality of spaced openings therein. The carrier may be formed of plastic or metal. The apparatus further includes an indexing mechanism that functions to place each temporary package in the predetermined assembly/diassembly position to allow the integrated circuit die to be positioned precisely therein.

Still another object of the present invention is to provide a method and apparatus which utilizes previously stored die characteristics for a die in a known temporary package and in a known boat to disassemble electrical dice and temporary packages from one another based on predetermined parameters and to classify the die appropriately.

According to more specific aspects of the present invention, an assembly system is provided to place die bond pads in electrical contact with temporary package electrical interconnects. Once the die bond pads are in contact with the electrical interconnects, the temporary package can be placed in a standard device tester and subjected to extensive testing. Such testing includes burn-in testing and the like to establish various die characteristics and eliminate mortality. These characteristics, while not meant to be limiting, include the quality of the electrical contact between the die and the temporary package in addition to classifying the die in the temporary package based on speed grade characteristics.

The method and apparatus in accordance with the present invention includes a system which picks up and places a die on a die inverter. The die is then inverted and placed in view of a rough die camera, which takes a picture of the die. Using positional feedback from the rough die picture, a robot having a primary gripper with a restraining device attached thereto retrieves the die. The die is then presented to a fine die camera by the robot and multiple pictures are taken. While the die is being located by the die cameras, a process carrier containing a plurality of temporary packages is simultaneously indexed to place a temporary package in a predetermined assembly/disassembly position along a conveyor. An electrical socket is then inserted into the temporary package for continuity testing.

A rough temporary package picture is then taken of the temporary package and used to determine a rough location of the temporary package at the assembly/disassembly position. In a preferred embodiment, a laser height sensor may be used to determine the height of the temporary package at the position prior to taking fine package vision pictures in order to keep the camera in focus. A fine temporary package camera is then positioned over the selected electrical interconnects of the temporary package at the assembly/disassembly position and multiple fine temporary package pictures are also taken.

The die and restraining device are then transferred by a primary gripper to the predetermined assembly/disassembly position. The robot aligns the die and temporary package using the fine temporary package and fine die pictures and presses the die, restraining device and package together to form an assembled package.

During the assembly process, the robot preferably drives to a minimum programmed assembly interlocking height and tests the completed assembly for continuity. If continuity is confirmed, the robot then releases the restraining device and die. If continuity is not established, the robot increments to a maximum programmed force setting. If continuity is still not established, the restraining device and die are removed from the temporary package. A new temporary package is placed in the predetermined assembly position and the fine die, rough package, and fine temporary package pictures are retaken. The die and new temporary package are then reassembled and retested.

In an alternative embodiment of the present invention, the robot drives down until physical contact is established between the die and the temporary package. After physical contact is established, the robot drives to a minimum programmed assembly interlocking height. The primary gripper releases the die and lid or other restraining device and retracts to a waiting position. Electrical continuity of the assembly is tested. If the assembly has electrical continuity between the die and the temporary package, the process is completed. If electrical continuity is not established, the primary gripper retrieves the die and restraining device and awaits instruction from the operator. The operator may choose to retry the present temporary package, utilize the next package, or purge the die from the system and use the next die.

Any electromechanical device which is capable of transferring component parts from one position to another may be used in the present invention. In a preferred embodiment, however, the transferring device is a robot arm. The apparatus has a control mechanism including a microprocessor and associated program routines that selectively control the robot arm (i) to move the primary gripper to pick up a restraining device and to a lid feeder station to pick up a lid, (ii) to move the primary gripper along with the lid and restraining device to pick up the die following photographing by the rough die camera, (iii) to move the primary gripper along with the lid and the die to a position to be photographed by the fine die camera, and (iv) to move the lid and the die to the predetermined assembly/disassembly position located along the conveyor.

The control routines also function to return the primary gripper to the predetermined assembly position and retrieve the die and restraining device in the event that continuity is not established with the temporary package. The primary gripper then returns to select a second lid, another restraining device and a second die while the carrier is simultaneously indexed to place the next temporary package of the carrier in the predetermined assembly/disassembly position along the path. The assembly process continues in this manner.

The present invention also includes a method and apparatus for disassembling the electrical die and temporary package based on predetermined parameters or characteristics. The disassembly process occurs in a manner substantially opposite the assembly process. In particular, a carrier containing a plurality of temporary packages approaches the predetermined assembly/disassembly position. Each package contains an electrical die which has been subjected to extensive testing. The primary gripper retrieves the electrical die and inverts the die using a die inverter. A lid precisor similar to the one used for assembly is used to place the lid in a known location. The die is thus separated from the temporary package.

The foregoing has outlined some of the more pertinent objects of the present invention. These objects should be construed to be merely illustrative of some of the more prominent features and applications of the invention. Many other beneficial results can be attained by applying the disclosed invention in a different manner or modifying the invention as will be described. Accordingly, other objects and a fuller understanding of the invention may be had by referring to the following Detailed Description of the preferred embodiment.

BRIEF DESCRIPTION OF THE SEVERAL VIEWS OF THE DRAWINGS

For a more complete understanding of the present invention and the advantages thereof, reference should be made to the following Detailed Description taken in connection with the accompanying drawings in which:

FIGS. 1B–1C are side views of the assembly/disassembly system shown in FIG. 1A;

FIGS. 2A–2B are side and plan views, respectively, of a die pack feeder for use in accordance with the present invention;

FIGS. 5A–5B are front and side views of a primary gripper of a robot arm;

FIG. 6 illustrates a clip tray feeder for use in the present invention;

FIGS. 7A–7B illustrate plan and side views, respectively, of a lid feeder station suitable for use in accordance with the present invention;

FIG. 7C is an enlarged view of the lid carousel illustrated in FIG. 7A;

Similar reference characters refer to similar parts throughout the several views of the drawings.

DETAILED DESCRIPTION OF THE INVENTION

The inventive method and apparatus will now be described in conjunction with the continuous positioning of integrated circuit dice within temporary packages. It should be appreciated that the use of the invention for this purpose should be considered merely exemplary and that the techniques and mechanisms described herein can be used whenever it is desired to accurately position, bond or attach dice.

Figure 1A:
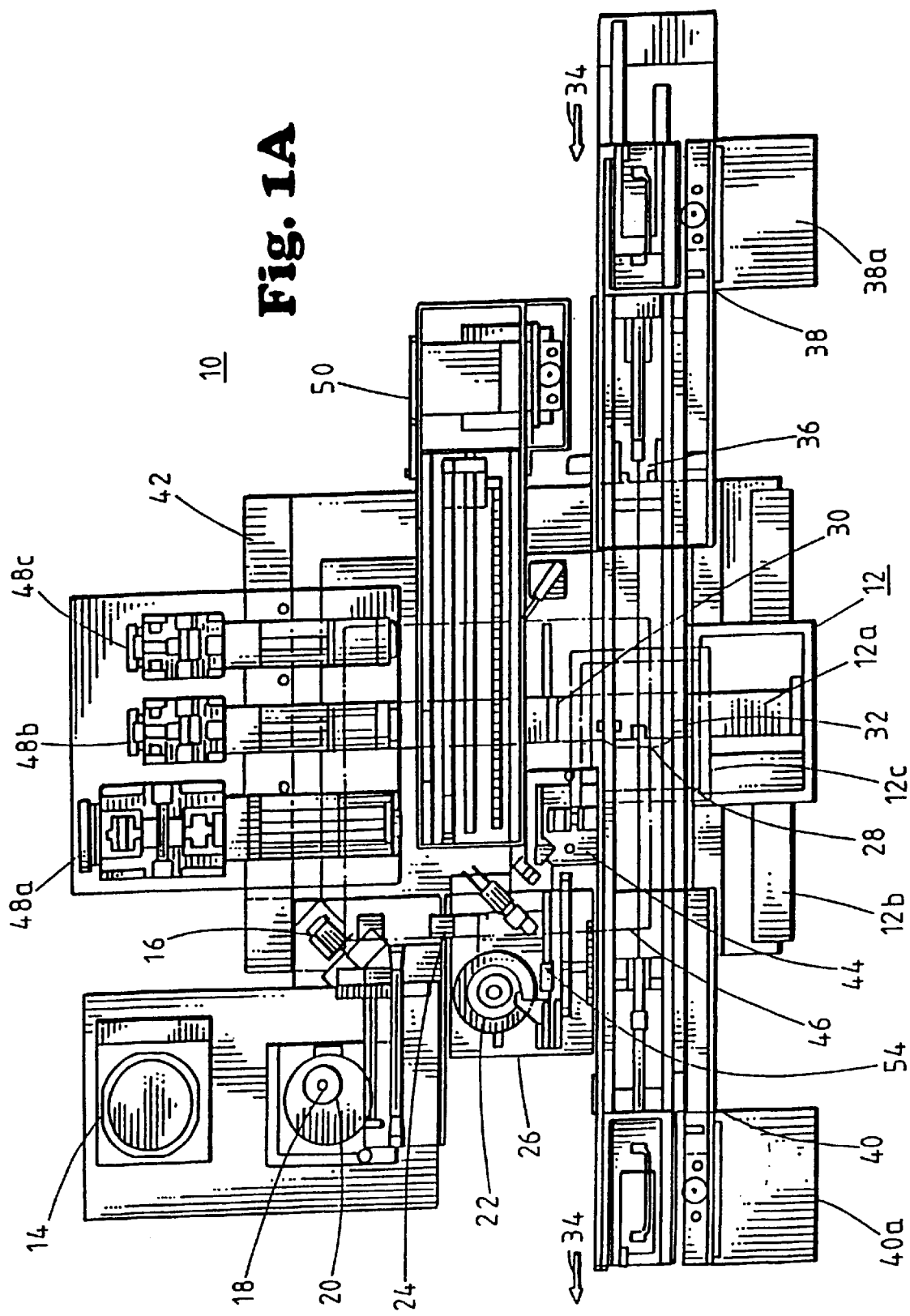
FIG. 1A is a plan view of an assembly/disassembly system for automatically positioning dice within temporary packages in accordance with the present invention.

In an exemplary embodiment, a method and apparatus are provided for automatically positioning dice within temporary packages to facilitate extensive testing. As shown in FIG. 1A, the apparatus 10 generally includes surface 42, a programmable robot arm system 12, which preferably includes three arms 12a, 12b and 12c, wafer feeder station 14, die inverter 16, rough die camera 24, a lid feeder station 22, lid precisor 26, fine die camera 30, predetermined assembly/disassembly position 28, clip tray feeder 50, and rough and fine temporary package cameras (not shown in FIG. 1A). The assembly/disassembly position 28 is located along a conveyor 36 that conveys a carrier along a linear path indicated by arrow 34 between a first position, corresponding to inlet 38, and a second position, corresponding to outlet 40. The die, restraining device and temporary package are assembled at assembly/disassembly position 28 as will be described more fully herein.

It should be appreciated that each carrier enters the apparatus at the inlet 38 and then travels along the path through the assembly/disassembly position 28 where the dice are positioned within the packages in the carrier. The continuity between the die and temporary package is preferably evaluated at assembly/disassembly position 28. Thereafter, the carrier is conveyed through the outlet 40 and the die is then subjected to additional testing.

Although not shown in detail in FIG. 1A, it is desired that a plurality of carriers, each supporting a number of temporary packages, be continuously supplied to conveyor 36. While not meant to be limiting, this can be accomplished by the use of a carrier input elevator 38a and carrier output elevator 40a. A new carrier is supplied at the inlet after all packages in a previous boat located at the assembly/disassembly position 28 have been indexed through predetermined position 28. Die and restraining devices, such as lids and/or clips, are then supplied to the packages in the new carrier. Appropriate sensor and indexing assemblies are located at the inlet 38 and outlet 40 of the conveyor 36 to control the movement of carriers thereon.

Conveyors, such as those manufactured by Flexible Technology located in Richardson, Tex., are suitable for use in the present invention. Other conveyors, such as flat belt conveyors, timing belt conveyors, walking beam mechanisms and the like are also suitable for use in the present invention. The conveyor is controlled by a suitable electric motor and gearing mechanism, as is well-known in the art.

As described generally above, a plurality of cameras is used in accordance with the present invention to ensure precise placement of dice within temporary packages. While not meant to be limiting, one embodiment of the present invention utilizes five cameras or image producers. As will become apparent, a first camera is used to accurately locate the initial position of a wafer and individual die before the die is moved. Two additional cameras are used to locate the die and the remaining two cameras are used to locate the temporary package or device under testing (hereinafter "DUT"). The present invention uses rough cameras to locate the die's and DUT's general positions such that the die and DUT can each be positioned in the respective fine cameras' fields of view. Preferably, the fine cameras have fields of view in the range of about 0.0020". In an alternative embodiment, three cameras are utilized, namely, a first camera to accurately locate the position of a wafer and individual die, a die camera and a temporary package camera.

Figure 1B:
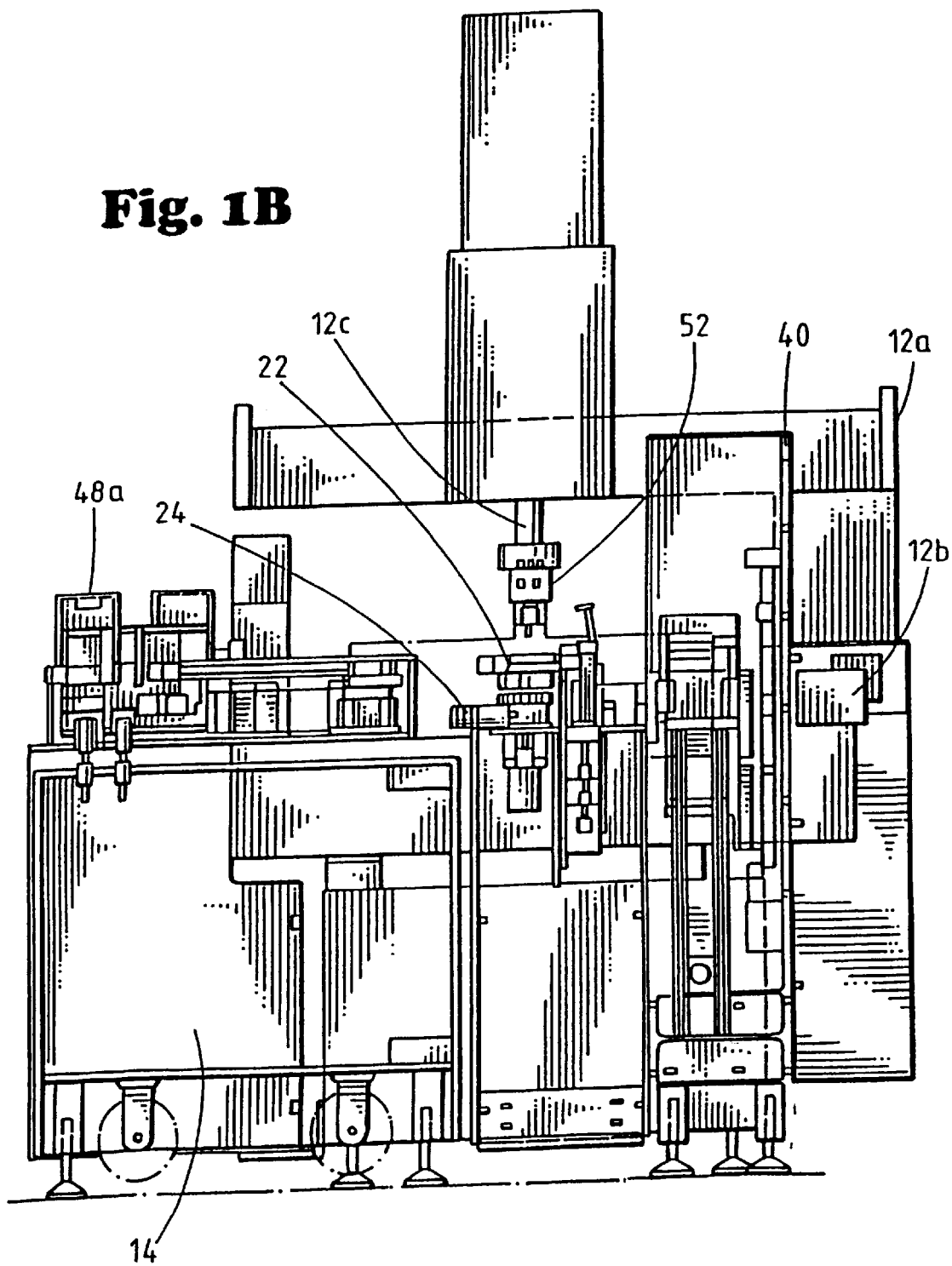

The basic operating method of the automatic die placement apparatus can now be described. Referring now to FIGS. 1A–1C, in which an apparatus 10 for automatically positioning dice within temporary packages in accordance with the present invention is shown, wafers, which have been previously tested to select dice from a wafer map or ink dot, are positioned in wafer feeder station 14. The wafers may have previously been divided into individual dice. Alternatively, singulated dice may be supplied to die pack feeders 48a–48c.

FIGS. 2A–2B illustrate side views of a 2×2" die pack feeder 48b. The die pack feeder 48b includes die pack input 60 and output 66, die shuttle 62 and pneumatic cylinder 64. Alternatively, a 4×4" die pack feeder may be used or, as shown in FIG. 1A, a 2×2" die pack feeder 48b and a 4×4" die pack feeder 48a may both be utilized. Die pack feeder 48b are particularly suitable for use in the invention when singulated dice are supplied to apparatus 10. Packs are placed into input 60 and one pack is then moved onto shuttle 62 by pneumatic cylinder 64 into the workcell. Dice are then placed into or taken out of the packs. When the process is completed, shuttle 62 is moved by pneumatic cylinder 64 to die pack output 66.

Figure 3B:
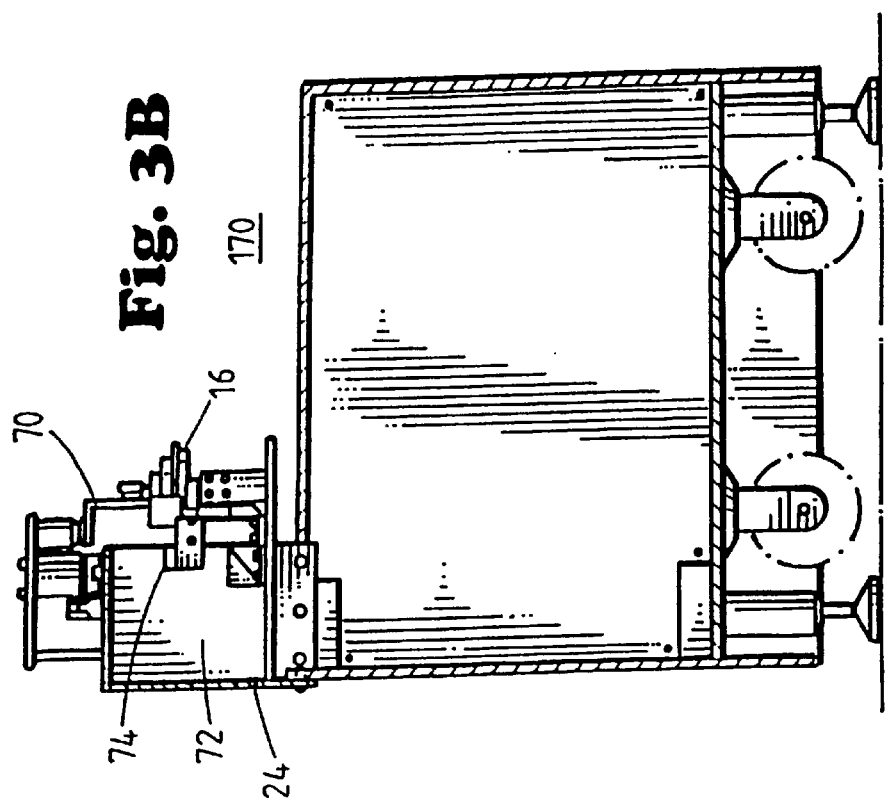
FIGS. 3A–3C are side views of a wafer handler base having a transfer mechanism which is suitable for use in the present invention.
Figure 3A:
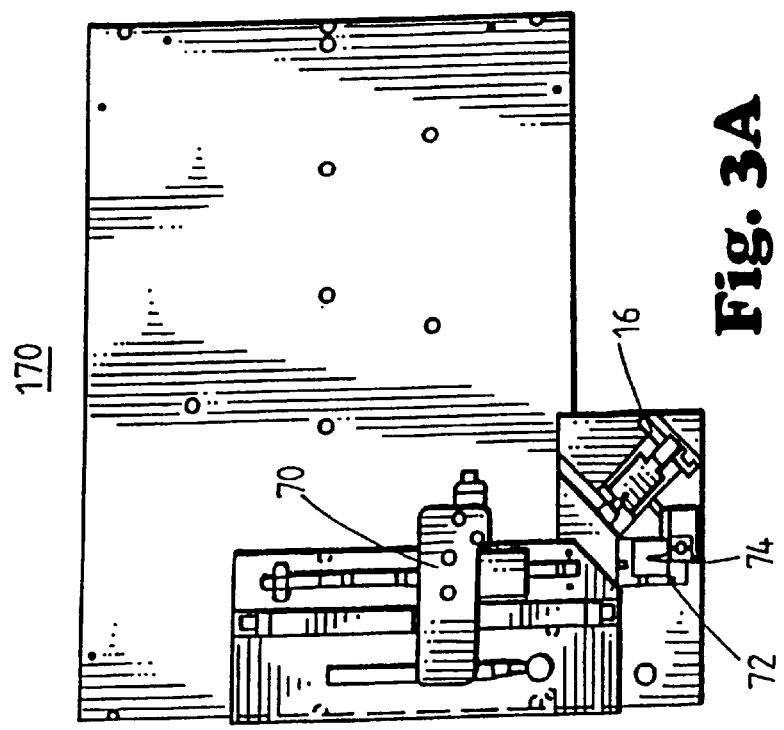
Figure 3C:
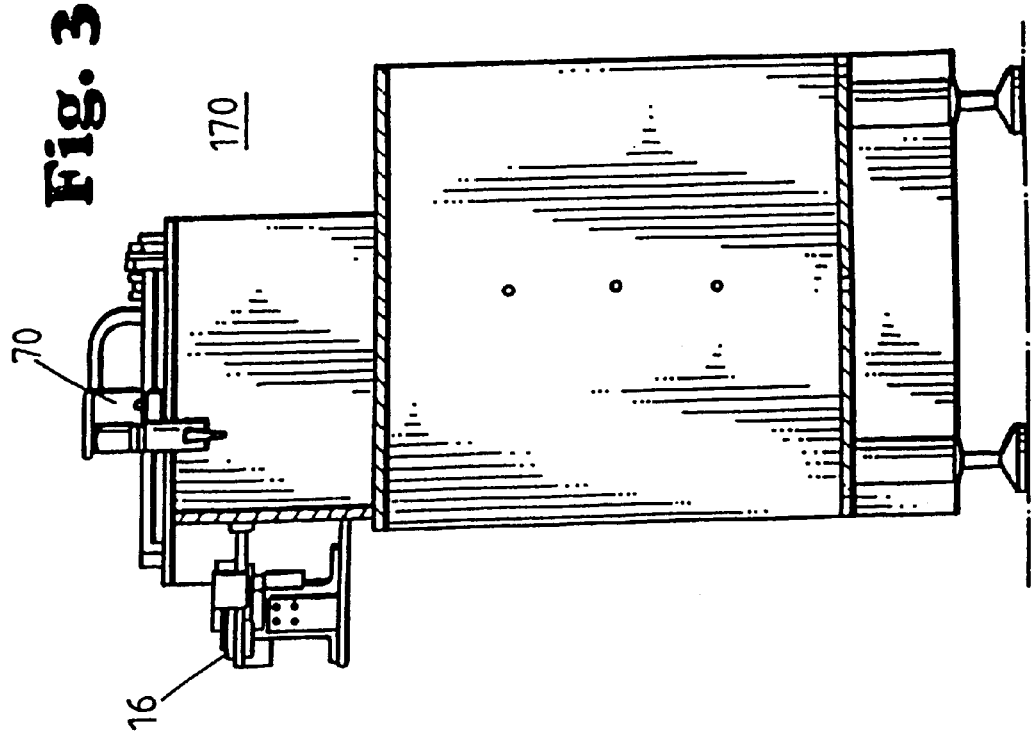

Alternatively, a wafer handler base 170, as illustrated in FIGS. 3A–3C, may be used when the dice are supplied in wafer form. First camera 20, as shown in FIG. 1A, is preferably positioned over location 18. Location 18 corresponds to a die transfer position. First camera 20 is preferably located to look down at the film frame and wafer. First camera 20 first determines the exact position of the wafer on the film frame by looking for combi marks or fiducial marks on the wafer. The camera then takes a picture of each die to verify that the die is there, verify that there is no ink dot on the die, and locate the die's exact position to account for any change in position when the film frame is stretched.

Die transfer arm 70, shown in FIGS. 3A–3C, of the present invention picks up a die from location 18 and places the die on die inverter 16. The die is then inverted by die inverter 16, placed on die pedestal 74 and brought into view of rough die camera 24. While not meant to be limiting, the die is picked off of wafer handler base 170 or die pack feeder 48b using vacuum quills and pneumatic cylinders. The cylinders are reciprocated in such a manner that the die is transported and placed on die inverter 16.

Figure 4:
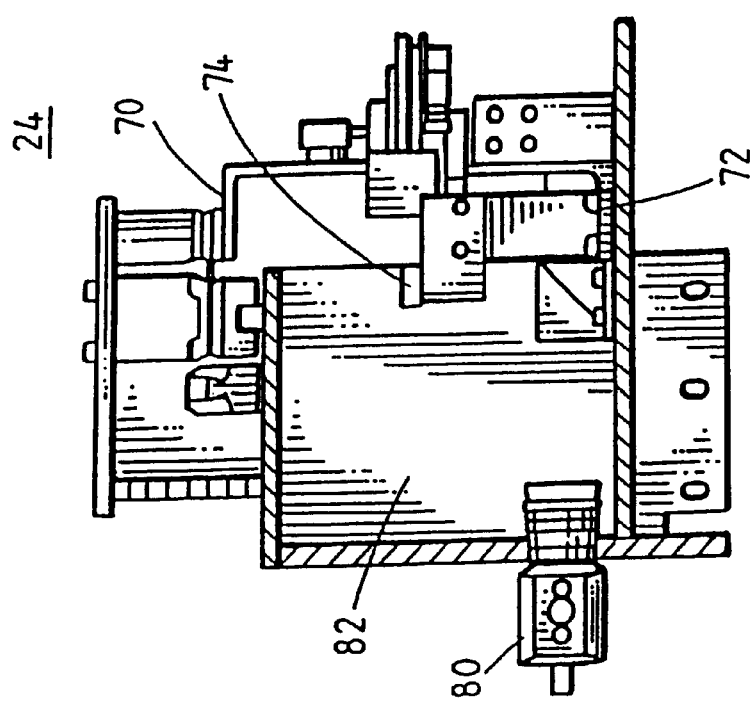
FIG. 4 is a side view of a rough die camera which may be used in the present invention.

Rough die camera 24 is preferably located on surface 42 behind lid feeder station 22. As shown in FIG. 4, rough die camera 24 includes a CCD (Charge Coupled Device) camera 80, lens 82 and prism 72. Rough die camera 24, which is preferably located behind lid feeder station 22, looks up at the die through prism 72 and die inverter 16 to determine the general position or location of the die so that robot arm 12 using gripper 52 (FIG. 1B) may place the die within the field of view of fine die camera 30. Prior to rough die camera 24 taking a picture, the die is preferably illuminated with backlighting. Rough die camera 24 then takes a picture of the die at die pedestal 74.

The rough die picture is analyzed utilizing a computer program to determine the rough position of the die. A blob finder is used to locate the centroid of the die, which is held on the die pedestal 74. The blob finder analyzes the binary (black/white) picture of the die and pedestal. Based on the position of the centroid, an edge finding ruler is utilized in the negative Y direction (away from the pedestal arm) in order to locate the bottom edge of the die, as referenced in the vision window. A line finding box is then used at the bottom edge of the die to locate the angle of the bottom die edge.

The die size is preferably known and stored in the data file (IGES format in particular) associated with the die. An edge finding ruler is utilized in the negative X direction relative to the vision window. The edge finding ruler starts in the centroid of the die and is used to locate an edge of the die perpendicular to the edge located above. A line finding box is used at the perpendicular edge to locate the angle of the side edge. Once the angle and location of two perpendicular sides of the die are determined, two edge finding rulers are placed over the image. One ruler is placed across the die in order to measure the width of the die. The second ruler is placed perpendicular to the first ruler to find the length of the die to determine the exact size of the die. The center position of the die is calculated, using the average of the angles obtained above.

Using positional feedback data from the computer and rough die picture, robot arm 12 then orients primary gripper 52 to the die. As shown in FIGS. 5A–5B, primary gripper 52 preferably includes vacuum quill 90, linear slide 94 and suction cups 92. Primary gripper 52, which has a restraining device attached thereto, retrieves the die. While not meant to be limiting, the restraining device may be a bridge clip, a clip and lid, screw or combination thereof. When lids are used with clips as the restraining device, lid transfer arm 54 shown in FIGS. 7A–7B selects a lid from lid feeder station 22 and presents the lid to lid precisor 26. Lid precisor 26 is used to place lids in a known location.

In a preferred embodiment, lid feeder station 22 supports a plurality of lids in multiple stacks on a rotatable carousel 100 shown in FIG. 7A. As the lids are exhausted from each stack in the carousel, the carousel 100 rotates to present a new stack to the lid transfer arm 54. When all stacks of the carousel 100 are exhausted, the carousel 100 may be rotated away from the lid transfer arm 54 and a new carousel provided.

FIGS. 7A–7B illustrate lid feeder station 22 while FIG. 7C depicts a plan view of a lid carousel 100 for use in the present invention.

Figure 8A:
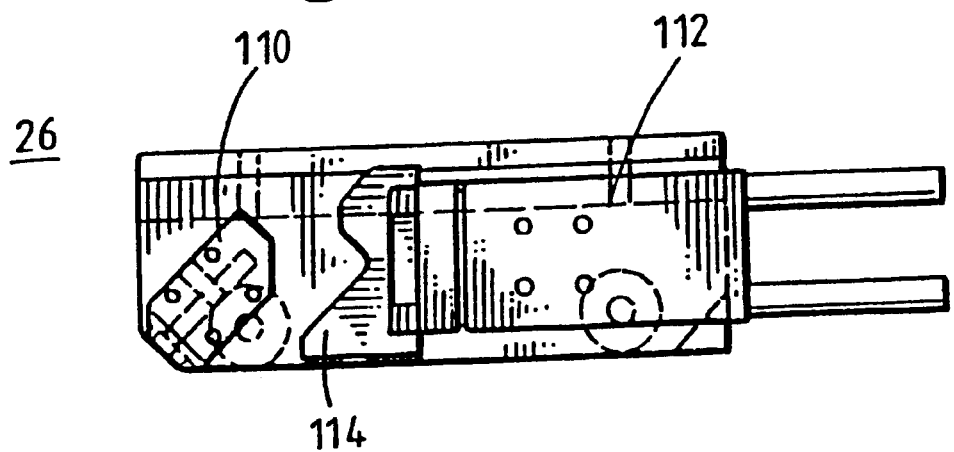
FIGS. 8A–8B are plan and side views, respectively, of a lid precisor which is suitable for use in accordance with the present invention.
Figure 8B:
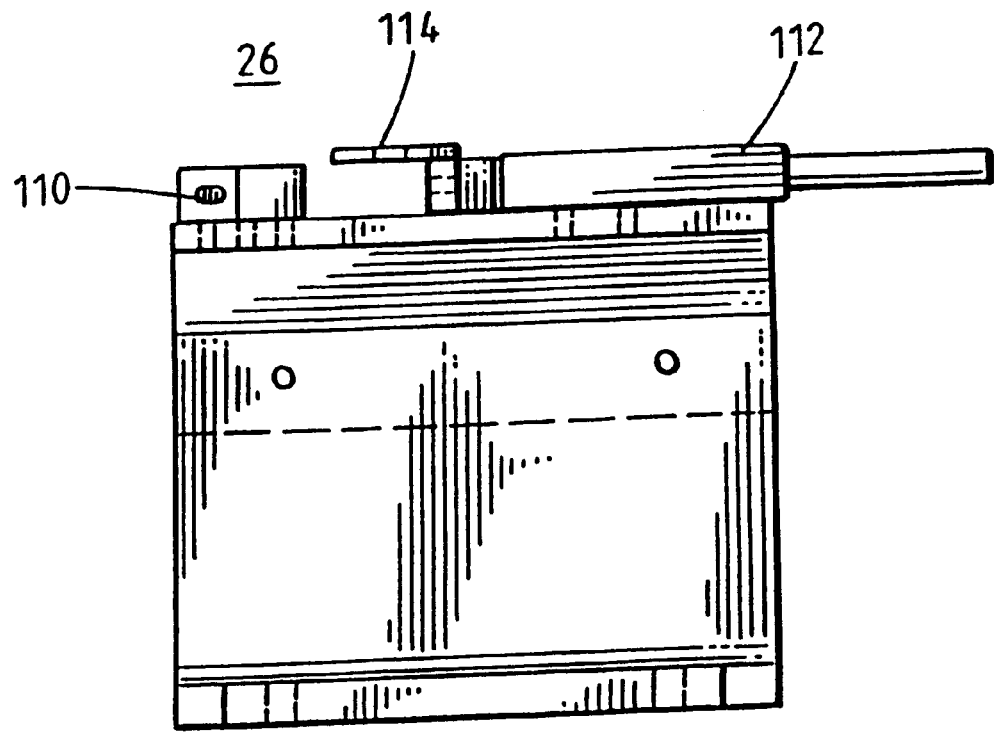

As mentioned above, lid transfer arm 54 selects a lid from lid feeder station 22 and presents the lid to lid precisor 26. FIG. 8A illustrates a plan view of lid precisor 26 while FIG. 8B depicts a side view of lid precisor 26. Lid precisor 26 includes a vacuum chuck 110, pneumatic cylinder 112 and precisor block 114.

Figure 14A:
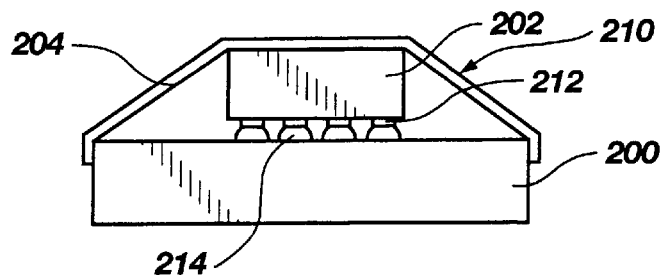
FIGS. 14A, 14B and 14C respectively depict schematic representations of different restraining devices retaining a die to a temporary package.
Figure 14B:
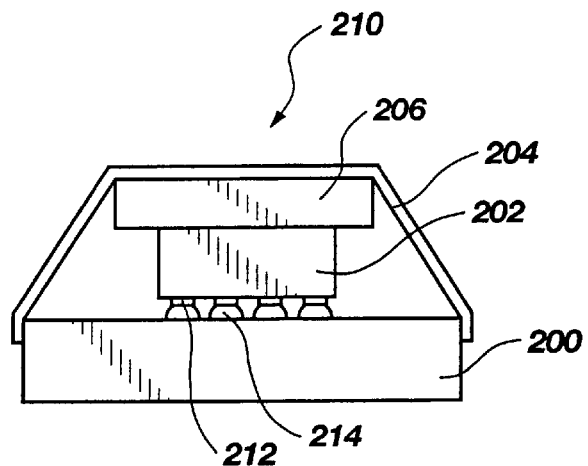
Figure 14C:
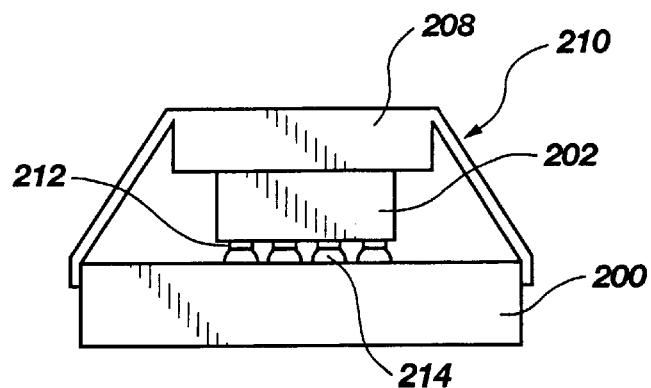

A clip or other restraining device 210 secures the die 202 in the temporary package 200 during testing with bond pads 212 of the die in electrical contact with electrical interconnects 214 of temporary package 200 (see FIGS. 14A–C). Clips, which may have various configurations, provide physical connection of the tops of then temporary packages to the bottoms thereof, in some embodiments. FIG. 6 illustrates a clip tray feeder which is suitable for use in the present invention. More specifically, clip tray feeder preferably includes an elevator 120 which carries a stack of clip trays for presentation to the machine. Each clip tray is individually removed and pulled into the robot's work volume by the tray presentation arms (not shown). The clip tray feeder 50 will utilize different styles of clips by utilizing optional clip trays. As shown in FIG. 14-C, the restraining device 210 may include a clip 204, a clip 204 and lid 206, or a clip/lid combination 208 which is formed as a unit, each restraining device 210 is used in conjunction with a die 200. Preferably, however, a clip 204 is picked up by the primary gripper 52 before a lid 206 and a die 202. The lid is placed on the vacuum chuck 110 shown in FIGS. 8A and 8B and the pneumatic cylinder is actuated, pressing the precisor block 114 against the lid. Thus action outs the lid into a location that is "known" to robot arm system 12. It should be appreciated that the present invention is not limited to a restraining device which includes clips and lids. Any method of restraint is possible. For example, screws, adhesives or the like may be substituted or used in addition to clips.

In an alternative embodiment, the restraining device need not be picked up. Rather, the restraining device may be attached to or be an integral part of the temporary package.

After the die has been picked up by the primary gripper 52, the die is then presented to fine die camera 30. Fine die camera 30 is preferably located on surface 42 near conveyor 36 so that it looks sideways through a prism, up at the die. The surface 42 of apparatus 10 may be constructed of metal, granite or a vibration isolation table. Surface 42, however, is preferably formed of granite. A granite base provides stability, which is critical for precision and accuracy. Fine die camera 30 determines the precise location of the die and takes multiple pictures of the die such that the die bond pads and electrical interconnects can be properly aligned.

More specifically, the die is secured and opposite corners of the die are presented to the fine die camera 30. The following algorithm describes the analysis done for each corner of the die. First, a picture of the die corner is taken. The binary picture is used for all subsequent analysis steps. Two edge finding rulers are positioned across the width and height of the screen in order to locate the edges of the die features (Vbb ring, bond pad, etc.) specified. Once the two edges are located, line finding boxes are placed at the transition points of the edges of the die features. These are used to locate the angle of the die corner. The angles and points are used to mathematically calculate the corner point of the die etching in the field of view of the camera. The X and Y position of the corner point is the only information used from the fine die picture.

Once the die X and Y points of two opposite corners are known, two additional pictures are taken in order to precisely determine the angle of the die. The pictures are taken by placing two opposite features of the die in front of the camera. The features are on the same side of the die, however. By locating two points of the etching along the same side of the die, the angle of the die relative to the angle of the gripper can be calculated.

A picture is taken and the binary picture is used for all subsequent analysis steps. An edge finding ruler is utilized from the top of the vision window in the negative Y direction in order to locate the etching of the die. At the point where the etching is located, a line finding box is placed across the screen, perpendicular to the edge finding ruler in order to verify that the edge of the die has been located. This information is later used to position the die in proper alignment with the temporary packages.

While pictures are being taken by fine die camera 30, a process carrier or boat with temporary packages positioned therein is brought into the work cell in the direction of arrow 34 shown in FIG. 1. The carrier is conveyed along conveyor 36 between the inlet 38 and the outlet 40, but positioned to stop at predetermined assembly/disassembly position 28. Appropriate sensor and indexing assemblies are located at the inlet 38 and outlet 40 of conveyor 36 to control the movement of the carriers thereon.

Figure 9:
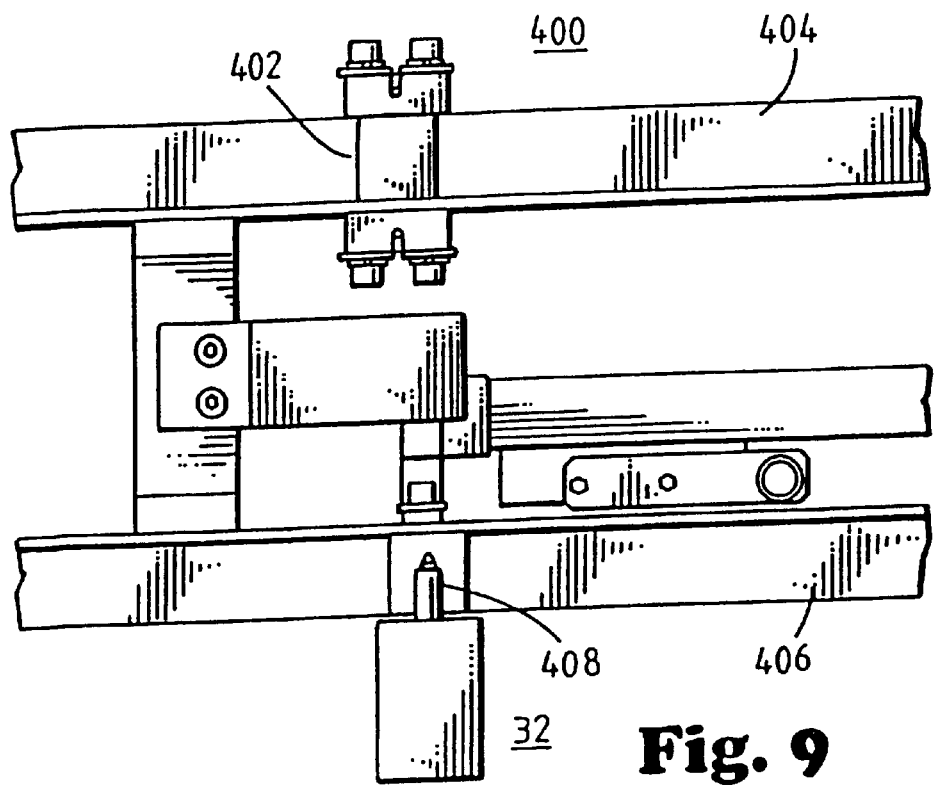
FIG. 9 is a plan view of the various components of an indexing mechanism for use in accurately positioning the boat in the assembly/disassembly station of the apparatus.

Each carrier or boat includes a body portion and a pair of side rails. The side rails preferably include a plurality of spaced positioning holes. As seen in FIG. 9, an indexing mechanism 400 includes a through-beam sensor 402 mounted on one rail 404 of conveyor 36 and a locking mechanism 32 supported on the opposite rail 406. The through-beam sensor includes an LED and phototransistor for counting the number of spaced positioning holes in the side rail of the carrier.

When a predetermined number of holes have been counted, locking mechanism 32 is actuated to drive a plunger 408 into one of the positioning holes to lock the boat into position. As long as the number of holes and their relative spacing is known, it is thus possible to use the indexing mechanism 400 to control the selective movement of the boat through the assembly station regardless of the size of the boat or the number of packages therein.

Figure 12B:
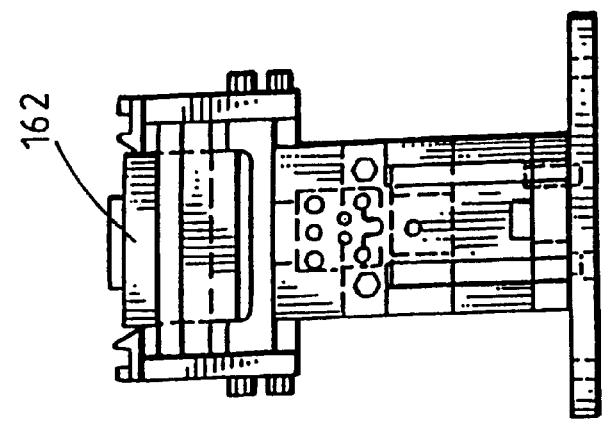
FIGS. 12A–12B show an unclipping mechanism in a lowered position which is suitable for use in the disassembly process of the present invention.

Each carrier supports a number of temporary packages. For example, carriers containing five or ten temporary packages are suitable for use in the present invention. While the number of temporary packages in a carrier may vary and while not meant to be limiting, it has been found that four temporary packages in one carrier is particularly well suited for use in accordance with the present invention. Temporary packages are preferably placed in a socket container to provide electrical contact between the temporary packages and burn-in boards, load boards, and the like. While not meant to be limiting, the socket preferably raises up in assembly/diassembly position 28 to insure electrical contact. However, any method of insuring contact is sufficient. An electrical socket 162 shown in FIG. 12B is then plugged into the temporary package for continuity testing to test that the die and the temporary package make electrical contact during assembly. Each opening in the boat includes a pair of locking slots which secures restraining devices such as clips attached to the die to temporary packages in a boat.

The present invention includes a general purpose computer control system for controlling the operation of the apparatus 10. The control system includes one or more work stations having a microprocessor having associated storage, appropriate operating system and control programs, and suitable I/O devices (such as a keyboard, mouse, display and printer). The apparatus further advantageously uses a robot arm that is controlled by a special purpose computer control system. Although not meant to be limiting, preferably the robot is a 4-axis GANTRY robot arm which is commercially available from Adept Technology, Incorporated located in San Jose, Calif. The robot arm is controlled by associated control software routines that effect sequential movements of the robot arm in accordance with the processing steps.

Although not shown in detail, it should be appreciated that the various control mechanisms of the apparatus are selectively controlled by suitable actuators under the control of software programs resident in the control microprocessors. Such control mechanisms are well known in the art.

Figure 10:
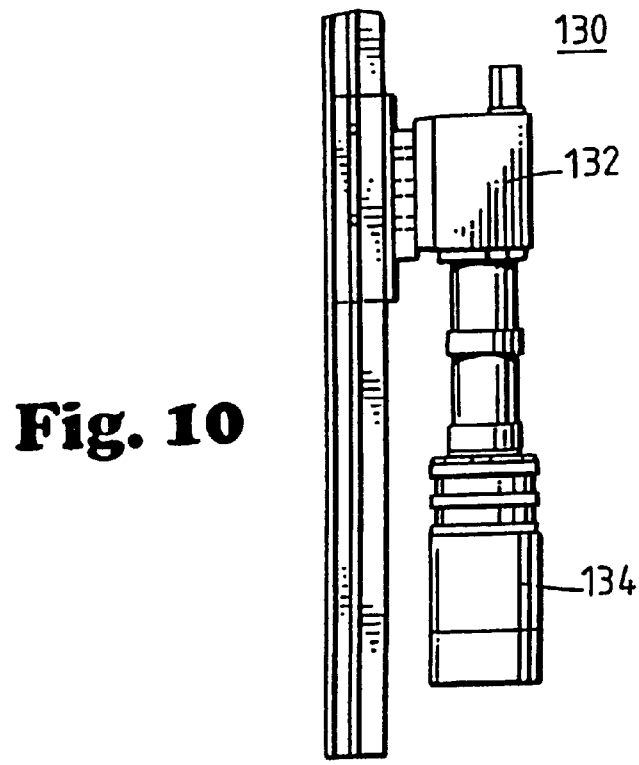
FIG. 10 shows a rough temporary package camera for use in accordance with the present invention.
Figure 11A:
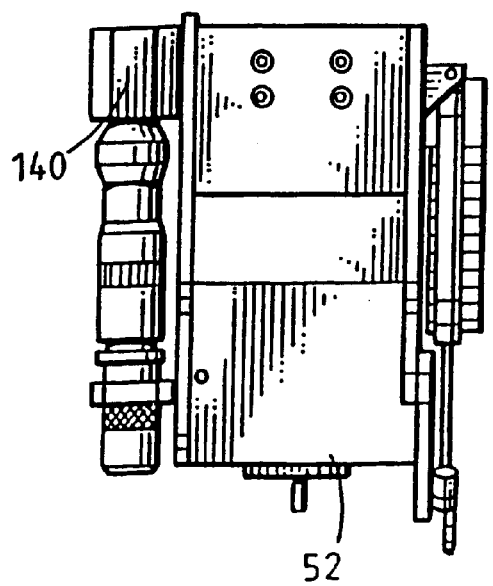
FIGS. 11A–11B illustrate side views of a fine temporary package camera and secondary gripper which are suitable for use in accordance with the present invention.

The present invention further includes two temporary package cameras or DUT cameras as illustrated in FIGS. 10 and 11A. A rough temporary package picture is taken by the rough temporary package camera 130 shown in FIG. 10 to locate the temporary package in the carrier. The rough temporary package camera 130 includes a CCD (charge coupled device) camera 132 and lens 134. The rough temporary package picture is analyzed to determine the rough location of the temporary package. While not meant to be limiting, the height of the temporary package is preferably determined by a laser height sensor such as that manufactured by OMRON being placed over the temporary package.

The rough DUT camera 130 is preferably located on the Z axis of robot arm 12c and positioned to look down at the DUT or temporary package. The rough DUT camera 130 determines the DUT's general position in the carrier so that fine DUT camera 140 (FIG. 11A) can move into correct position.

A picture is taken by camera 140, and the binary picture is used for all subsequent analysis steps. Six rulers are utilized starting at the top of the vision window in the negative Y direction. Once the rulers are placed, the closest transition is taken to be the major line of the temporary package electrical interconnects. A line finding box is placed perpendicular to the rulers at the transition point in order to locate the angle of the major line of electrical interconnects. From the data (IGES) file, the following parameters are known: (a) the X distance between the fiducial mark and the major line of the temporary package and (b) the side of the temporary package where the fiducial mark is located.

A transition finding ruler is placed across the package to locate the fiducial mark. A blob finding box is placed around the fiducial mark in order to precisely locate the fiducial centroid. Once the centroid is located, the center of the temporary package and the location of the electrical interconnects that the die is aligned with are calculated utilizing the data file information.

Figure 11B:
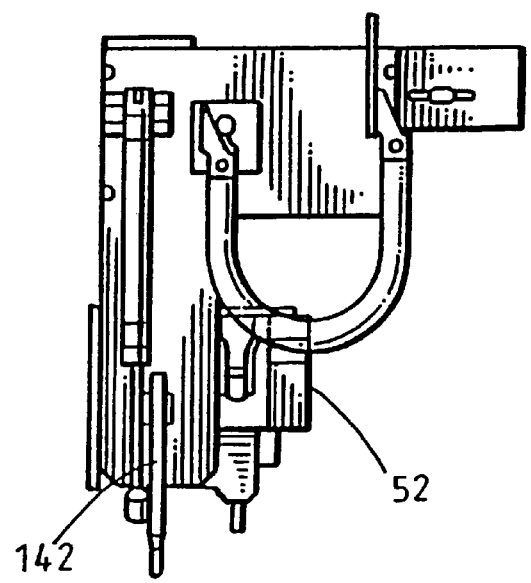

Using the rough temporary package picture analysis and the height sensor results, fine temporary package or DUT camera 140 as illustrated in FIG. 11A and in FIG. 11B, is positioned over the selected electrical interconnects utilizing robot arm system 12. Fine DUT camera 140 is located on the Z axis of robot arm system 12 and looks down towards the DUT. Fine DUT camera 140 determines the precise location of the DUT so that the electrical interconnects and bond pads of the die can be properly aligned with the DUT. Fine DUT camera 140 preferably takes at least one picture at each end of the DUT. In a preferred embodiment, a secondary gripper 142, such as that shown in FIG. 11B, is also included. Secondary gripper 142 includes a vacuum quill, linear slide and pneumatic cylinder and is used to transfer dice that are presented to the die pack feeders 48a–48c.

Robot arm system 12 moves the fine DUT camera 140 over the user specified electrical interconnects. If the temporary package is built to specifications, and the rough temporary package location was successful, the chosen electrical interconnects should be placed in the center of the field of view of fine DUT camera 140.

A picture is taken of the electrical interconnect and a copy of the picture is created. The second copy of the picture is "added" to the original picture preferably four times. This method is termed GRAYSCALE ADDITION. This has the effect of isolating the temporary package features and "whiting out" the rest of the picture. The modified GRAYSCALE picture is then converted to a binary picture. A blob finder box is placed across the whole picture in order to locate all electrical interconnects in the picture. The electrical interconnect closest to the center of the picture is selected and an arc finding circle is placed around that point with the same diameter as the electrical interconnects. This locates the center of the electrical interconnect.

Using the fine temporary package pictures and the fine die pictures, robot arm system 12 aligns the die and temporary package and presses the two together, thereby creating a completed assembly. During the assembly process, robot arm system 12 preferably drives to a minimum programmed assembly locking height and tests the completed assembly for continuity. If continuity is confirmed, robot arm system 12 then releases the restraining device or devices and die. If, however, continuity is not established, the robot arm systems increments to a maximum programmed force setting. If continuity is still not established, the restraining device and die are removed from the temporary package. A new package is then positioned and the fine die, rough temporary package, and fine temporary package pictures are retaken and the die and new temporary package are reassembled.

In an alternative embodiment of the invention, the assembly process includes robot arm system 12 driving until physical contact is established between the die and the temporary package. After physical contact is established, robot arm system 12 drives to minimum programmed assembly interlocking height. The primary gripper 52 releases the lid and/or clip and the die and then retracts to a waiting position. Electrical continuity of the assembly is tested. If the assembly has electrical continuity between the die and the temporary package, the process is completed. If electrical continuity is not established, the primary gripper 52 retrieves the die, lid and/or restraining device and awaits instruction from the operator. The operator then decides whether to retry the present package, utilize the next package, or purge the die from the system and use the next die.

As mentioned above, the present invention utilizes two files to determine which features on the die and DUT will be located and positioned for alignment. While not meant to be limiting, preferably the files are IGES files. However, any file such as DXF or the like which is capable of CAD data transfer is suitable for use in accordance with the present invention. One file is for the die and the other is for the DUT or temporary package. Any CAD program is suitable for use to create the drawings, but the drawings are preferably saved in the file format.

The DUT and die drawings should mirror one another, i.e. if one drawing were placed face-down on top of the other, the selected features should line up with one another.

By taking pictures of the diagonal ends of each of the die and temporary package, and using an algorithm, a die can thus be precisely positioned within a temporary package in a fraction of the time required by prior art techniques. For example, prior art techniques require approximately four minutes to assemble a die in a temporary package. The present invention is capable of positioning a die in a temporary package in about 30 seconds and does so in a manner which is more precise and reliable than those techniques used in accordance with the prior art. Moreover, the methods and apparatus of the present invention provide for improved positioning of the die bond pads relative to the temporary package electrical interconnects than those obtained using prior art techniques.

The present invention also includes a disassembly process for disassembling the die from the temporary package. The disassembly process is substantially the opposite of the assembly process. Dice in temporary packages which have been subjected to testing enter the disassembly apparatus in boats on conveyor 36 as in the assembly process. Carriers are indexed through the apparatus 10 and are designed to proceed to predetermined disassembly position 28 as in the assembly process.

Figure 12A:
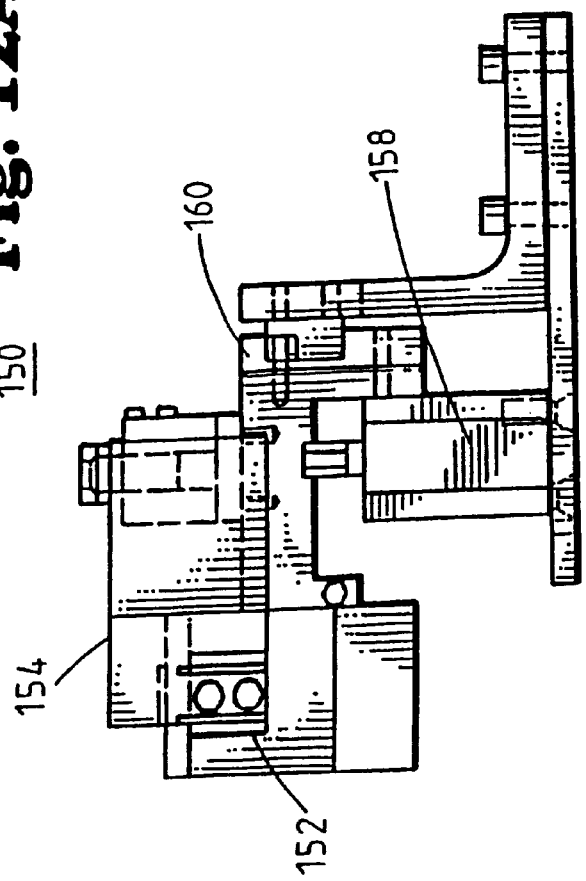

Referring now to FIGS. 12A–12B, an unclipping mechanism 150 is shown. Unclipping mechanism 150 is preferably positioned along conveyor 36 near predetermined disassembly position 28. As shown in FIGS. 12A–12B, unclipping mechanism 150 includes a pneumatic parallel jaw actuator 152, clip release fingers 154, a pneumatic cylinder 158 and a linear slide 160. FIG. 12A depicts the unclipping mechanism 150 in a lowered position in which the electrical test socket disconnects from the temporary package. Prior to unclipping, the primary gripper 52 is placed by the robot arm system 12 into contact with the clip and/or lid and die. The unclipping mechanism, which is raised prior to unclipping, releases the clip from the assembled package and recycled to the clip tray feeders.

Figure 13:
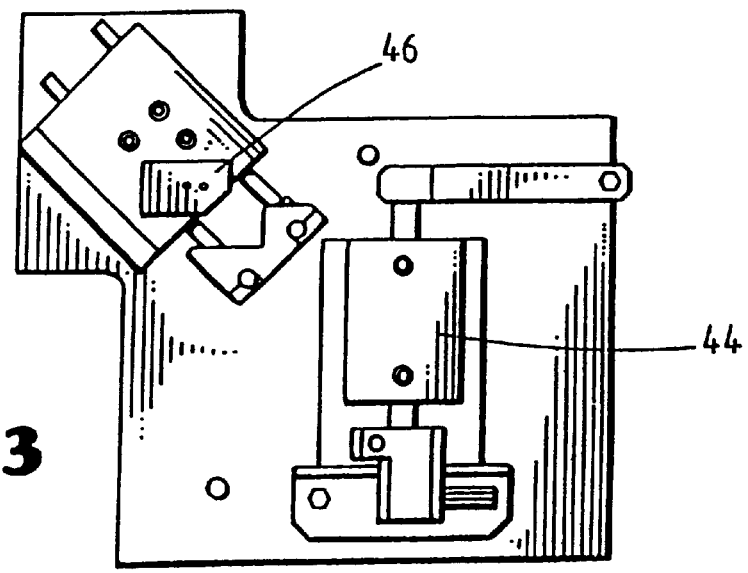
FIG. 13 illustrates a secondary inverter and die precisor for use in the disassembly process of the present invention.

The clip, lid and die are then removed from the temporary package by primary gripper 52 and moved to disassembly inverter 44 shown in FIGS. 1 and 13. The die is placed on disassembly inverter 44 which is similar to die inverter 16. The inverted die is then reinverted such that the die is face up on disassembly precisor 46 which is similar to lid precisor 26 utilized in the assembly process.

The die is moved to one of the die pack feeders 48a–48c using secondary gripper 142 based on predetermined characteristics of the die. For example, dice having a certain grade or quality may be transported to feeder 48a while dice having a designated speed grade characteristic are transported to feeder 48b. Feeder 48c is generally reserved for dice which are rejected, i.e. dice which do not meet minimum characteristics. In this manner, the dice are removed and classified according to predetermined characteristics for later assembly in component packages. Additional stations may also be included to further categorize or separate the die based on various properties.

After the die is removed from the boat and is being subjected to inversion by inverter 44, the carrier is simultaneously indexed such that the next package in the boat is moved into predetermined disassembly position 28. In this manner, the disassembly process is continuous. After all of the dice are removed from the carrier, the carrier continues along conveyor 36 to outlet 40 while the next carrier enters inlet 38.

It should be appreciated by those skilled in the art that the specific embodiments disclosed above may be readily utilized as a basis for modifying or designing other structures for carrying out the same purposes of the present invention. For example, other known uses for this type of technology include, but are not limited to, flip chip die bonding, chip on board bonding, any high accuracy die attach process, and known good die assembly utilizing any temporary carrier technology. Additionally, it is within the scope of the invention to assemble the die in the package such that testing is done with the die being in an upright position rather than in an inverted position. The die may then be inverted during disassembly or alternatively remain in an upright position. It should also be realized by those skilled in the art that such equivalent constructions do not depart from the spirit and scope of the invention as set forth in the appended claims.

What is claimed is:

1. A method of positioning a semiconductor die relative to a temporary package, comprising the steps of:
    forming a representation of at least a portion of said semiconductor die and storing said representation of said at least a portion of said semiconductor die in a data file;
    moving said semiconductor die to a location proximate a temporary package;
    comparing said stored representation of said at least a portion of said semiconductor die to a representation of at least a portion of said temporary test package stored in a data file;
    utilizing said compared representations to define movement of a die moving assembly, and moving said semiconductor die with said die moving assembly to place said semiconductor die and said temporary package into a desired relation to one another; and
    securing a restraining device and said temporary package together to retain said semiconductor die in said desired relation to said temporary package.

2. The method of claim 1, further comprising generating said representation of said at least a portion of said semiconductor die with a camera.

3. The method of claim 1, further comprising generating said representation of said at least a portion of said temporary package with a camera.

4. The method of claim 1, further comprising generating said representation of said at least a portion of said temporary package as a graphic image.

5. The method of claim 4, further comprising generating said representation of said at least a portion of said temporary package as a computer aided design-generated image.

6. The method of claim 1, further comprising the step of determining electrical continuity between said semiconductor die and said temporary package.

7. The method of claim 1, wherein moving said semiconductor die with said die moving assembly comprises moving said semiconductor die with a robot.

8. The method of claim 1, wherein moving said semiconductor die with said die moving assembly comprises moving said semiconductor die with a vacuum die lifting assembly.

9. The method of claim 1, further comprising securing said restraining device to said temporary package with said die moving assembly.

\* \* \* \* \*

UNITED STATES PATENT AND TRADEMARK OFFICE
CERTIFICATE OF CORRECTION

PATENT NO. : 6,353,312 B1
DATED : March 5, 2002
INVENTOR(S) : Warren M. Farnworth et al.

It is certified that error appears in the above-identified patent and that said Letters Patent is hereby corrected as shown below:

Column 1,
Line 6, change "APPLICATION" to -- APPLICATIONS --.
Line 29, change "packages" to -- package --.

Column 5,
Lines 51-52, change "invention, and;" to -- invention; and --.

Column 7,
Line 15, change "48*b* are" to -- 48*b* is --.

Column 8,
Line 58, change "14-C" to -- 14C --.

Column 10,
Line 41, change "Incorporated" to -- Incorporated, --.

Column 14,
Line 3, delete "the steps of".
Line 13, delete "test".
Line 34, delete "the step of".

Signed and Sealed this

Twenty-eighth Day of February, 2006

JON W. DUDAS
*Director of the United States Patent and Trademark Office*